United States Patent
Tanaka et al.

(10) Patent No.: US 12,454,030 B2
(45) Date of Patent: Oct. 28, 2025

(54) SOLDER COMPOSITION AND METHOD FOR MANUFACTURING FLEXIBLE CIRCUIT BOARD

(71) Applicant: TAMURA CORPORATION, Tokyo (JP)

(72) Inventors: Sumire Tanaka, Iruma (JP); Yurika Munekawa, Iruma (JP); Daigo Ichikawa, Iruma (JP)

(73) Assignee: TAMURA CORPORATION, Tokyo (JP)

( * ) Notice: Subject to any disclaimer, the term of this patent is extended or adjusted under 35 U.S.C. 154(b) by 580 days.

(21) Appl. No.: 17/942,506

(22) Filed: Sep. 12, 2022

(65) Prior Publication Data
US 2023/0100601 A1    Mar. 30, 2023

(30) Foreign Application Priority Data
Sep. 16, 2021 (JP) ................... 2021-150920

(51) Int. Cl.
| | |
|---|---|
| B23K 35/362 | (2006.01) |
| B23K 35/36 | (2006.01) |
| B23K 101/42 | (2006.01) |
| H05K 1/02 | (2006.01) |
| H05K 1/11 | (2006.01) |
| H05K 3/34 | (2006.01) |

(52) U.S. Cl.
CPC ........ *B23K 35/362* (2013.01); *B23K 35/3613* (2013.01); *B23K 35/3618* (2013.01); *H05K 1/028* (2013.01); *H05K 1/118* (2013.01); *H05K 3/3463* (2013.01); *B23K 2101/42* (2018.08); *H05K 2203/0571* (2013.01)

(58) Field of Classification Search
CPC ........ C23C 2/02; C23C 2/0222; C23C 2/026; C23C 8/10; C23C 8/80; C21D 1/76; C21D 9/561; C21D 1/74
See application file for complete search history.

(56) References Cited

U.S. PATENT DOCUMENTS

2020/0384581 A1* 12/2020 Kawasaki ............ B23K 35/365

FOREIGN PATENT DOCUMENTS

| JP | 2015-006687 A | 1/2015 |
|---|---|---|
| JP | 2015-064545 A | 4/2015 |
| JP | 2015-123491 A | 7/2015 |
| JP | 5887330 | 2/2016 |
| JP | 2017-064761 A | 4/2017 |
| JP | 2017-177166 A | 10/2017 |
| JP | 2018-053215 A | 4/2018 |
| JP | 2018-202472 A | 12/2018 |
| JP | 2019-130566 A | 8/2019 |
| JP | 2019-147185 A | 9/2019 |
| JP | 2020040120 A * | 3/2020 ......... B23K 35/3618 |
| JP | 6928294 B1 | 9/2021 |
| JP | 6928296 B1 | 9/2021 |
| WO | 2008/007635 A1 | 1/2008 |

OTHER PUBLICATIONS

JP-2020040120-A: Espacenet English machine translation (Year: 2020).*
Information Offer Form submitted by a third party for the corresponding Japanese patent application No. 2021-150920 on Feb. 13, 2024; English machine translation included, 14 pages.
"Notification" from Commissioner of Patent Office regarding Japanese Patent Application JP 2021-150920, dispatched Apr. 18, 2023, 2 pages.
Information Offer Form submitted by a 3rd party regarding JP Patent Application JP 2021-150920, notified on Apr. 18, 2023, 8 pages.
Kenji Sawazaki, "Technical Trends of Photoresists and Resist Inks", Publication Name—Recent Trends in Printed Circuit Technology, Published Nov. 30, 1991, Journal of Printing Science and Technology, vol. 28, No. 6, pp. 420-424 (English Abstract on p. 1), 5 pages.
Japanese Office Action dated Nov. 28, 2023, Japanese Application No. 2021-150920, English translation included, 8 pages.

* cited by examiner

*Primary Examiner* — Adil A. Siddiqui
(74) *Attorney, Agent, or Firm* — Rankin, Hill & Clark LLP

(57) ABSTRACT

A solder composition contains: a flux composition containing an (A) rosin resin, a (B) activator, a (C) thixotropic agent, and a (D) solvent; and (E) solder powder, in which the (B) component contains a (B1) dicarboxylic acid having 3 to 8 carbon atoms, the (C) component contains at least one selected from the group consisting of a (C1) amide thixotropic agent having a hydroxy group in one molecule and a (C2) glycerol thixotropic agent having a hydroxy group in one molecule, and the solder composition satisfies a condition represented by Numerical Formula (F1) below provided that a total of contents of the (C1) component and the (C2) component is defined as X and a content of the (B1) component is defined as Y, $$X/2 \leq Y \leq 5X \qquad \text{(F1)}.$$

10 Claims, No Drawings

SOLDER COMPOSITION AND METHOD FOR MANUFACTURING FLEXIBLE CIRCUIT BOARD

The entire disclosure of Japanese Patent Applications No. 2021-150920 filed Sep. 16, 2021 is expressly incorporated by reference herein.

TECHNICAL FIELD

The present invention relates to a solder composition and a method for manufacturing a flexible circuit board.

BACKGROUND ART

A solder composition is a paste mixture provided by kneading solder powder and a flux composition (a composition containing, for instance, a rosin resin, activator and solvent) (see Patent Literature 1: JP 5887330 B).

In view of a recent need for smaller and lighter electronic devices, it has been demanded to freely mount small components in order to save space. This leads to a growing demand for a solder composition enabling small components to be mounted on microlands of a board.

Further, in order to mount small components densely arranged in a small area using the solder composition, it is required that the solder composition used for one component does not affect its adjacent component(s). It is thus important that the solder composition is unlikely to affect an insulation coating on a printed wiring board. As described above, it is required that the solder composition is unlikely to affect the insulation coating and reliably attains solder spreadability.

SUMMARY OF THE INVENTION

An object of the invention is to provide a solder composition that is unlikely to affect an insulation coating and has excellent solder spreadability and a method for manufacturing a flexible circuit board including the solder composition.

According to an aspect of the invention, there is provided a solder composition containing: a flux composition containing an (A) rosin resin, a (B) activator, a (C) thixotropic agent, and a (D) solvent; and (E) solder powder, in which the (B) component contains a (B1) dicarboxylic acid having 3 to 8 carbon atoms, the (C) component contains at least one selected from the group consisting of a (C1) amide thixotropic agent having a hydroxy group in one molecule and a (C2) glycerol thixotropic agent having a hydroxy group in one molecule, and the solder composition satisfies a condition represented by Numerical Formula (F1) below provided that a total of contents of the (C1) component and the (C2) component is defined as X and a content of the (B1) component is defined as Y.

$$X/2 \le Y \le 5X \quad (F1)$$

According to another aspect of the invention, there is provided a method for manufacturing a flexible circuit board by soldering using the solder composition according to the above aspect of the invention, the method including: applying the solder composition on a flexible wiring board; placing an electronic component on the solder composition; and mounting the electronic component on the flexible wiring board through heating by a reflow furnace under predetermined conditions.

According to the above aspects of the invention, a solder composition that is unlikely to affect an insulation coating and has excellent solder spreadability and a method for manufacturing a flexible circuit board including the solder composition can be provided.

DESCRIPTION OF EMBODIMENT(S)

A solder composition of an exemplary embodiment contains: a flux composition containing an (A) rosin resin, a (B) activator, a (C) thixotropic agent, and a (D) solvent; and (E) solder powder, in which the (B) component contains a (B1) dicarboxylic acid having 3 to 8 carbon atoms, the (C) component contains at least one selected from the group consisting of a (C1) amide thixotropic agent having a hydroxy group in one molecule and a (C2) glycerol thixotropic agent having a hydroxy group in one molecule, and the solder composition satisfies a condition represented by Numerical Formula (F1) below provided that a total of contents of the (C1) component and the (C2) component is defined as X and a content of the (B1) component is defined as Y.

$$X/2 \le Y \le 5X \quad (F1)$$

According to the exemplary embodiment, the solder composition unlikely to affect an insulation coating and having excellent solder spreadability can be obtained. The inventors presume the reason as follows.

The insulation coating on a printed wiring board is adversely affected by an organic acid in the flux composition. Further, an organic acid having a shorter carbon chain more adversely affects the insulation coating. However, in terms of solder spreadability, the organic acid having a short carbon chain is an essential component.

Meanwhile, the solder composition of the exemplary embodiment contains the (B1) dicarboxylic acid having 3 to 8 carbon atoms in combination with at least one selected from the group consisting of the (C1) amide thixotropic agent having a hydroxy group in one molecule and the (C2) glycerol thixotropic agent having a hydroxy group in one molecule. It is surprisingly found that this combined use can reduce the adverse effect of the (B1) component on the insulation coating. The inventors presume that this is because a three-dimensional structure formed by the (C1) component or the (C2) component can reduce the adverse effect of the (B1) component on the insulation coating.

Moreover, the inventors have found that the total X of contents of the (C1) component and the (C2) component and the content Y of the (B1) component satisfying the above condition represented by Numerical Formula (F1) can provide both unlikeliness to affect the insulation coating and solder spreadability. The inventors presume that the above effects of the invention are achievable as described above.

The unlikeliness to affect the insulation coating is particularly required in manufacturing a flexible circuit board. This is because an insulation coating formed on the flexible wiring board tends to be highly flexible but inferior in solder heat resistance. Thus, the solder composition of the exemplary embodiment can be suitably used particularly for manufacturing the flexible circuit board.

In order to exhibit both unlikeliness to affect the insulation coating and solder spreadability, a value of the content Y of the (B1) component is preferably 2x/3 or more, more preferably 3x/4 or more, still more preferably 4x/5 or more, and still further more preferably 9x/10 or more. An upper limit of the value of Y is preferably 4x or less, more preferably 3x or less, still more preferably 2x or less, and still further more preferably 3x/2 or less.

Flux Composition

Firstly, the flux composition used in the exemplary embodiment will be described. The flux composition used in the exemplary embodiment, which is a component other than the solder powder in the solder composition, contains the (A) rosin resin, the (B) activator, the (C) thixotropic agent, and the (D) solvent described below.

(A) Component

Examples of the (A) rosin resin used in the exemplary embodiment include rosins and a rosin-modified resin. Examples of the rosins include gum rosin, wood rosin and tall oil rosin. Examples of the rosin-modified resin include disproportionated rosin, polymerized rosin, hydrogenated rosin, and derivatives thereof. Examples of the hydrogenated rosin include fully hydrogenated rosin, partially hydrogenated rosin, and hydrogenated product of unsaturated-organic-acid modified rosin (also referred to as "hydrogenated acid modified rosin"), which is modified rosin of an unsaturated organic acid such as an aliphatic unsaturated monobasic acid (e.g., (meth)acrylic acid), an aliphatic unsaturated dibasic acid (e.g., α,β-unsaturated carboxylic acid such as fumaric acid and maleic acid), and an unsaturated carboxylic acid having an aromatic ring (e.g., cinnamic acid). One of these rosin resins may be used alone, or two or more thereof may be used in mixture.

A content of the (A) component is preferably in a range from 20 mass % to 70 mass %, more preferably in a range from 30 mass % to 60 mass %, and still more preferably in a range from 35 mass % to 50 mass % with respect to 100 mass % of the flux composition. At a content of the (A) component of equal to or more than the above lower limit, a copper-foil surface of a soldering land is prevented from being oxidized, so that so-called solderability, which is a property of making molten solder easily get wet on the copper-foil surface, can be improved to sufficiently reduce solder balls. At a content of the (A) component of equal to or less than the above upper limit, a flux residue can be sufficiently reduced.

(B) Component

The (B) activator used in the exemplary embodiment needs to contain the (B1) dicarboxylic acid having 3 to 8 carbon atoms.

Examples of the (B1) component include malonic acid, succinic acid, glutaric acid, adipic acid, pimelic acid, and suberic acid.

In terms of solder spreadability, the content of the (B1) component is preferably in a range from 0.1 mass % to 20 mass %, more preferably in a range from 0.5 mass % to 15 mass %, still more preferably in a range from 1 mass % to 10 mass %, and still further more preferably in a range from 2 mass % to 6 mass % with respect to 100 mass % of the flux composition.

The (B) component may further contain another activator (hereinafter also referred to as a (B2) component) in addition to the (B1) component as long as an object of the invention is achievable. Examples of the (B2) component include: an organic acid other than the (B1) component; a halogen activator; and an amine activator. However, from the viewpoint that the (B2) component may adversely affect the effects of the invention, the (B) component preferably only contains the (B1) component. Further, a total of contents of the (B1) component is preferably 50 mass % or more, more preferably 60 mass % or more, and still more preferably 70 mass % or more with respect to 100 mass % of the (B) component.

The content of the (B) component is preferably in a range from 0.1 mass % to 30 mass %, more preferably in a range from 0.5 mass % to 20 mass %, still more preferably in a range from 1 mass % to 10 mass %, and still further more preferably in a range from 2 mass % to 6 mass % with respect to 100 mass % of the flux composition. A content of the (B) component of equal to or more than the above lower limit tends to improve the activation effect. Meanwhile, a content of the (B) component of equal to or less than the above upper limit tends to be able to maintain an insulating property of the flux composition.

(C) Component

The (C) thixotropic agent used in the exemplary embodiment needs to contain at least one selected from the group consisting of the (C1) amide thixotropic agent having a hydroxy group in one molecule and the (C2) glycerol thixotropic agent having a hydroxy group in one molecule.

The (C1) component is an amide thixotropic agent having a hydroxy group in one molecule. When the amide thixotropic agent does not have a hydroxy group, the adverse effect of the (B1) component on the insulation coating cannot be reduced. Further, the (C1) component is preferably a bisamide thixotropic agent having two or more hydroxy groups in one molecule.

Examples of the (C1) component include ethylene bishydroxystearic acid amide, hexamethylene hydroxystearic acid amide, and hydroxystearic acid amide. Among the above examples, in terms of the above, ethylene bishydroxystearic acid amide or hexamethylene hydroxystearic acid amide is preferable.

The (C2) component is a glycerol thixotropic agent having a hydroxy group in one molecule. When the glycerol thixotropic agent does not have a hydroxy group, the adverse effect of the (B1) component on the insulation coating cannot be reduced.

The (C2) component is exemplified by a hydrogenated castor oil.

The (C) component may further contain another thixotropic agent (hereinafter also referred to as a (C3) component) in addition to the (C1) component and the (C2) component as long as an object of the invention is achievable. Examples of the (C3) component include an amide thixotropic agent other than the (C1) component, a glycerol thixotropic agent other than the (C2) component, kaolin, colloidal silica, organic bentonite, and glass frit. However, in order to achieve the effects of the invention, the (C) component preferably only contains the (C1) component and the (C2) component. Further, the total of the contents of the (C1) component and the (C2) component is preferably 80 mass % or more, more preferably 90 mass % or more, and still more preferably 95 mass % or more with respect to 100 mass % of the (C) component.

A content of the (C) component is preferably in a range from 0.5 mass % to 15 mass %, more preferably in a range from 1 mass % to 10 mass %, and particularly preferably in a range from 2 mass % to 8 mass % with respect to 100 mass % of the flux composition. At a content of the (C) component of equal to or more than the above lower limit, sagging during printing tends to be improved. Meanwhile, at a content of the (C) component of equal to or less than the above upper limit, excessively high thixotropy is liable to be exhibited to cause a printing defect.

(D) Component

A well-known solvent can be appropriately selected as the (D) solvent used in the exemplary embodiment. The solvent to be used preferably has a boiling point of 170 degrees C. or more. A glycol solvent is also preferable.

Examples of the solvent include diethylene glycol, dipropylene glycol, triethylene glycol, hexylene glycol, hexyl diglycol, 1,5-pentanediol, methyl carbitol, butyl carbitol, 2-ethylhexyl diglycol (EHDG), octanediol, phenyl glycol, tetraethylene glycol dimethyl ether, tripropylene glycol monobutyl ether (BFTG), and dibutyl maleic acid. One of these solvents may be used alone, or two or more thereof may be used in mixture.

A content of the (D) component is preferably in a range from 20 mass % to 70 mass %, more preferably in a range from 30 mass % to 60 mass % with respect to 100 mass % of the flux composition. When the content of the (D) component falls within the above range, the obtained solder composition can have a viscosity appropriately adjusted to a suitable range.

Antioxidant

The flux composition in the exemplary embodiment preferably further contains an antioxidant in terms of solder meltability and the like. A well-known antioxidant is appropriately usable as the antioxidant used herein. Examples of the antioxidant include a sulfur compound, a hindered phenol compound and a phosphite compound. Among the above examples, a hindered phenol compound is preferable.

Examples of the hindered phenol compound include pentaerythritol tetrakis[3-(3,5-di-tert-butyl-4-hydroxyphenyl) propionate], bis[3-(3-tert-butyl-4-hydroxy-5-methylphenyl) propionic acid][ethylenebis(oxyethylene)], N,N'-bis[2-[2-(3,5-di-tert-butyl-4-hydroxyphenyl)ethylcarbonyloxy]ethyl] oxamide, and N,N'-bis{3-(3,5-di-tert-butyl-4-hydroxyphenyl) propionyl}hydrazine.

Other Components

The flux composition used in the exemplary embodiment may contain another additive and further another resin as required in addition to the (A) component, the (B) component, the (C) component, the (D) component, and the antioxidant. Examples of the other additive include an antifoaming agent, modifier, delustering agent, and foaming agent. A content of the additive is preferably in a range from 0.01 mass % to 5 mass % with respect to 100 mass % of the flux composition. The other resin is exemplified by an acrylic resin.

Solder Composition

Next, the solder composition of the exemplary embodiment will be described. The solder composition of the exemplary embodiment contains the above-described flux composition of the exemplary embodiment and the (E) solder powder as described below.

A content of the flux composition is preferably in a range from 5 mass % to 35 mass %, more preferably in a range from 7 mass % to 15 mass %, and still more preferably in a range from 8 mass % to 13 mass % with respect to 100 mass % of the solder composition. At a content of the flux composition of less than 5 mass % (i.e., at a content of the solder powder exceeding 95 mass %), the amount of the flux composition is insufficient as a binder, making the flux composition unlikely to easily mix with the solder powder. Meanwhile, at a content of the flux composition exceeding 35 mass % (i.e., at a content of the solder powder of less than 65 mass %), the resulting solder composition is unlikely to form a desired solder joint.

(E) Component

The (D) solder powder used in the exemplary embodiment preferably only contains lead-free solder powder, however, may be lead-containing solder powder. A solder alloy in the solder powder preferably contains at least one selected from the group consisting of stannum (Sn), copper (Cu), zinc (Zn), silver (Ag), antimony (Sb), lead (Pb), indium (In), bismuth (Bi), nickel (Ni), cobalt (Co), and germanium (Ge).

The solder alloy in the solder powder is preferably an alloy containing stannum as a main component. The solder alloy more preferably contains stannum, silver and copper. The solder alloy may contain at least one of antimony, bismuth, or nickel as an additive element. The flux composition of the exemplary embodiment, even when containing a solder alloy containing an easily oxidizable additive element such as antimony, bismuth and nickel, can reduce occurrence of voids.

Here, the "lead-free solder powder" means powder of solder metal or alloy to which lead is not added. However, lead as an unavoidable impurity may be contained in the lead-free solder powder. In this case, an amount of the lead is preferably 300 mass ppm or less.

Specific examples of the lead-free solder alloy powder include Sn—Ag—Cu solder powder, Sn—Cu solder powder, Sn—Ag solder powder, Sn—Bi solder powder, Sn—Ag—Bi solder powder, Sn—Ag—Cu—Bi solder powder, Sn—Ag—Cu—Ni solder powder, Sn—Ag—Cu—Bi—Sb solder powder, Sn—Ag—Bi—In solder powder, and Sn—Ag—Cu—Bi—In—Sb solder powder.

An average particle size of the (E) component, which is typically in a range from 1 µm to 40 µm, is more preferably in a range from 1 µm to 35 µm, still more preferably in a range from 2 µm to 35 µm, and still further more preferably in a range from 3 µm to 32 µm in view of applicability to an electronic board having narrow pitches between solder pads. The average particle size can be measured with a particle-size measurement device using dynamic light scattering.

Method for Manufacturing Solder Composition

The solder composition of the exemplary embodiment can be manufactured by containing the above-described flux composition and the above-described (E) solder powder at the above predetermined ratio, followed by mixing with agitation.

Method for Manufacturing Flexible Circuit Board

Next, a method for manufacturing a flexible circuit board in the exemplary embodiment will be described. The method for manufacturing the flexible circuit board in the exemplary embodiment is characterized by soldering using the above-described solder composition. According to the method for manufacturing the flexible circuit board in the exemplary embodiment, the flexible circuit board can be manufactured by mounting an electronic component on a flexible wiring board using the solder composition.

The above-described solder composition of the exemplary embodiment is unlikely to affect the insulation coating. Thus, the solder composition is also suitably usable for the flexible wiring board including the insulation coating that tends to be inferior in solder heat resistance.

Conventionally, the insulation coating on the flexible wiring board is provided by covering the flexible wiring board with a coverlay including an adhesive layer. However, with recent miniaturization of pads, solder resist, which is a photoimageable, photosensitive resin composition, has come to be used.

Meanwhile, in order to use the solder resist on the flexible wiring board, the solder resist is required to have flexibility. Thus, the solder resist tends to have a composition such that a cured product of the resin composition as the insulation coating has flex resistance but inferior solder heat resistance. This tendency is markedly exhibited especially in an alkaline-developable solder resist. Particularly during a reflow process, the flux component contained in the solder composition is liable to penetrate into an opening of the solder resist film to cause peeling thereof.

The alkaline-developable solder resist used in the exemplary embodiment preferably contains an (X1) photosensitive resin containing a carboxyl group, an (X2) photopolymerization initiator, an (X3) epoxy compound, and an (X4) reactive dilution agent.

The (X3) epoxy compound preferably has, for instance, at least one skeleton of a bisphenol A skeleton or a bisphenol F skeleton.

The (X4) reactive dilution agent preferably contains caprolactone-modified (meth)acrylate.

In order to have higher adhesion to the flexible board, the alkaline-developable solder resist particularly preferably contains an (X5) melamine compound. A cured product of the alkaline-developable solder resist can thus exhibit both heat resistance and flexibility.

An insulation coating formed by the alkaline-developable solder resist used in the exemplary embodiment preferably endures for five or more cycles, more preferably for ten or more cycles, and particularly preferably for 15 or more cycles in the following folding endurance test. An insulation coating enduring for a larger number of cycles is preferable as the insulation coating for the flexible wiring board but tends to be inferior in solder heat resistance.

The folding endurance test is performed as follows. A flexible wiring board is cut into a 25-mm width to prepare a test piece. The test piece is seam-folded and a weight of 1 kgf is applied on the test piece for five seconds. Subsequently, the test piece is unfolded and a weight of 1 kgf is applied on the fold line for five seconds. Then, the fold line is checked using a magnifier. The above procedures are repeated until generation of cracking to measure the number of cycles (the number of cycles completed before the generation of cracking).

For the flexible wiring board including the insulation coating that tends to be inferior in solder heat resistance, the flexible circuit board can be manufactured with no disadvantages by soldering using the above-described solder composition of the exemplary embodiment as described above. In other words, the above-described solder composition of the exemplary embodiment is particularly useful for manufacturing the flexible circuit board including the insulation coating in a form of the alkaline-developable solder resist film.

Here, a method for forming the insulation coating on the flexible wiring board (i.e., a forming method for the insulation coating) will be described.

In the forming method for the insulation coating, firstly, a flexible wiring board including a polyimide film and a copper wiring provided on the polyimide film is applied with a photosensitive resin composition at a desired thickness by a known method, such as screen printing, to form a coating film. Subsequently, preliminary drying is performed as required in order to volatilize a non-reactive dilution agent (organic solvent) in the photosensitive resin composition. In the preliminary drying, the flexible wiring board is heated at a temperature about of 60 to 100 degrees C. about for 5 to 30 minutes to make the coating film tack-free. Next, a negative film (photomask) having a circuit pattern where portions other than lands are light-transmissive is tightly placed on the coating film. An ultraviolet ray (having a wavelength, for instance, in a range from 300 to 400 nm) is applied on the negative film to photocure the coating film. Then, the photosensitive resin composition in a non-exposure region of the flexible wiring board corresponding to the lands is removed by a dilute aqueous alkaline solution to develop the coating film. As a method for the development, a spraying method, a showering method, or the like is usable. The dilute aqueous alkaline solution to be used is exemplified by a 0.5 to 5-mass % sodium carbonate aqueous solution. After the alkaline development, the coating film is thermally cured (post-cured) with a hot air circulating dryer or the like at 130 to 170 degrees C. for 20 to 80 minutes, so that the insulation coating in a form of a solder resist film can be formed on the flexible wiring board.

In the method for manufacturing the flexible circuit board according to the exemplary embodiment, firstly, the solder composition is applied on the flexible wiring board using a coating applicator.

Examples of the coating applicator to be used herein include a screen printer, a metal mask printer, a dispenser, and a jet dispenser.

The electronic component can be mounted on the flexible wiring board by a reflow process, in which the electronic component is placed on the solder composition applied by the coating applicator and heated by a reflow furnace under predetermined conditions to mount the electronic component on the flexible wiring board.

In the reflow process, the electronic component is placed on the solder composition and heated by the reflow furnace under the predetermined conditions. Through the reflow process, desired solder bonding can be performed between the electronic component and the flexible wiring board. As a result, the electronic component can be mounted on the flexible wiring board.

The conditions for the reflow process may be suitably set depending on a melting point of the solder. For instance, a preheating temperature is preferably in a range from 140 degrees C. to 200 degrees C., more preferably in a range from 150 degrees C. to 160 degrees C. A preheating time is preferably in a range from 60 seconds to 120 seconds. A peak temperature is preferably in a range from 230 degrees C. to 270 degrees C., more preferably in a range from 240 degrees C. to 255 degrees C. A retention time at a temperature of 220 degrees C. or more is preferably in a range from 20 seconds to 60 seconds.

The solder composition and the method for manufacturing the flexible circuit board according to the exemplary embodiment are not limited by the above exemplary embodiment and thus may be modified and/or improved as long as an object of the invention is achievable.

For instance, in the above method for manufacturing the flexible circuit board, the flexible wiring board and the electronic component are bonded to each other through the reflow process. However, any process is usable for bonding the flexible wiring board and the electronic component. For instance, the flexible wiring board and the electronic component may be bonded by heating the solder composition using a laser beam (i.e., laser heating process) instead of the reflow process. In this case, any laser beam source can be suitably used depending on a wavelength corresponding to an absorption band of the metal. Examples of the laser beam source include a solid-state laser (e.g., ruby, glass and YAG), a semiconductor laser (e.g., GaAs and InGaAsP), a liquid laser (e.g., pigment), and a gas laser (e.g., He—Ne, Ar, $CO_2$ and excimer).

EXAMPLE(S)

Next, the invention is further described in detail with reference to Examples and Comparatives but the scope of the invention is by no means limited by these Examples and Comparatives. It should be noted that materials used in Examples and Comparatives are as follows.

(A) Component
Rosin resin: hydrogenated acid modified rosin, trade name: "PINE CRYSTAL KE-604" manufactured by Arakawa Chemical Industries, Ltd.
(B1) Component
Dicarboxylic acid A: malonic acid
Dicarboxylic acid B: succinic acid
Dicarboxylic acid C: glutaric acid
Dicarboxylic acid D: adipic acid
Dicarboxylic acid E: suberic acid
(B2) Component
Dicarboxylic acid F: sebacic acid
Dicarboxylic acid G: eicosanedioic acid, trade name: "SL-20" manufactured by Okamura Oil Mill, Ltd.
Monocarboxylic acid A: capric acid
Monocarboxylic acid B: palmitic acid
Monocarboxylic acid C: isopalmitic acid
Monocarboxylic acid D: stearic acid
(C1) Component
Amide thixotropic agent A: hexamethylene hydroxystearic acid amide, trade name: "Slipax ZHH" manufactured by Mitsubishi Chemical Corporation
Amide thixotropic agent B: ethylene bishydroxystearic acid amide, trade name: "Slipax H" manufactured by Mitsubishi Chemical Corporation (C3) Component
Amide thixotropic agent C: ethylene bisstearic acid amide (molecular weight: 593), trade name: "Slipax E" manufactured by Nippon Chemical Trading Co., Ltd.
(D) Component
Solvent A: tripropylene glycol monobutyl ether (BFTG) manufactured by NIPPON NYUKAZAI CO., LTD.
Solvent B: diethylene glycol mono-2-ethylhexyl ether (2-ethylhexyl diglycol (EHDG)) manufactured by NIPPON NYUKAZAI CO., LTD.
(E) Component
Solder powder: alloy composition of Sn-3.0 Ag-0.5Cu, particle diameter distribution of 15 to 25 μm (corresponding to type 5 of IPC-J-STD-005 A), and a solder melting point of 217 to 220 degrees C.

Example 1

A rosin resin of 40 mass %, dicarboxylic acid A of 5 mass %, a solvent A of 50 mass %, and a thixotropic agent A of 5 mass % were charged into a container and mixed with a planetary mixer to obtain a flux composition.

Subsequently, the obtained flux composition of 11 mass %, a solvent B of 1.6 mass % and solder powder of 87.4 mass % (100 mass % in total) were charged into the container and mixed with a planetary mixer to prepare a solder composition.

Examples 2 to 8

Flux compositions and solder compositions of Examples 2 to 8 were prepared in the same manner as in Example 1 except that materials were blended in accordance with the corresponding compositions shown in Table 1.

Comparatives 1 to 17

Flux compositions and solder compositions of Comparatives 1 to 17 were prepared in the same manner as in Example 1 except that materials were blended in accordance with the corresponding compositions shown in Table 1.

Evaluation of Solder Compositions

Each of the solder compositions was evaluated by a method below in terms of solder heat resistance (a solid-coated portion and a pattern) and solder spreadability. The obtained results are shown in Table 1.

(1) Solder Heat Resistance (Solid-Coated Portion and Pattern)

A solder resist film ("DSR-2200" manufactured by TAMURA CORPORATION, an alkaline-developable solder resist for a flexible wiring board, film thickness: 20 μm) was formed on a printed wiring board (board material: FR-4, board thickness: 1.6 μm, Cu thickness: 50 μm). This solder resist contained 80 mass % or more, in terms of a solid content, of a photosensitive resin containing a carboxyl group, a bisphenol F epoxy compound, a photopolymerization initiator, a reactive dilution agent (caprolactone-modified (meth)acrylate), a coloring agent, an elastomer, melamine, and an extender pigment. The solder resist film endured for five or more cycles in the folding endurance test. This board for evaluation, on which the solder resist film was formed, was tested as follows in accordance with a test method according to JIS C-6481. A flux composition was applied over an entire surface of the board for evaluation. Subsequently, the board for evaluation was immersed in a solder bath at 260 degrees C. for 30 seconds and then was subjected to a peeling test using a cellophane tape. The above procedures constituted one cycle. A state of the insulation coating (a solid-coated portion and a pattern portion (formation of a 1-mm-diameter photo via)) after the procedures were repeated for one to three cycles was observed visually and with an optical microscope (at 200× magnification) to be evaluated for solder heat resistance in accordance with the following criteria. It should be noted that the flux composition was used for this evaluation in order to more strictly determine the effect of the solder composition on the insulation coating.

(i) Evaluation on Solid-Coated Portion

A: No change is observed on the insulation coating even after the procedures have been repeated for three cycles.

B: A slight change is observed on the insulation coating after the procedures have been repeated for three cycles.

C: A change is observed on the insulation coating after the procedures have been repeated for two cycles.

D: Peeling is observed on the insulation coating after the procedures have been performed for one cycle.

(ii) Evaluation on Pattern Portion

A: No change is observed on the insulation coating even after the procedures have been repeated for three cycles.

D: Slight peeling is observed on the insulation coating after the procedures have been repeated for two cycles.

E: Peeling is observed on the insulation coating after the procedures have been performed for one cycle.

(2) Solder Spreadability

Solder spreadability was tested as follows in accordance with a method described in JIS Z 3197 (1986), "Test methods for soldering resin fluxes", Section 6.10. 0.05 g of a flux composition was weighed and placed on a copper oxide plate, and a 3-cm-diameter ring of 1.6-diameter wire solder of JIS Z 3282 H60 A was placed on the flux composition. After the flux composition and the wire solder were melted in a solder bath at 250 degrees C., a flux residue was removed. The resultant solder was observed to be evaluated for solder spreadability in accordance with the following criteria.

A: Solder is sufficiently spread.

B: Solder is spread.

C: Solder is not spread.

D: Solder is not wetted on the copper plate.

TABLE 1

| | | | | Examples | | | | | | | | Comparatives | | | | | | | | | |
|---|---|---|---|---|---|---|---|---|---|---|---|---|---|---|---|---|---|---|---|---|---|
| | | | | 1 | 2 | 3 | 4 | 5 | 6 | 7 | 8 | 9 | 10 | 11 | 12 | 13 | 14 | 15 | 16 | 17 |
| Blending of Flux Composition (mass %) | (A) | | Rosin Resin | 40.0 | 40.0 | 40.0 | 40.0 | 40.0 | 40.0 | 40.0 | 40.0 | 40.0 | 40.0 | 40.0 | 40.0 | 40.0 | 40.0 | 40.0 | 40.0 | 40.0 |
| | (B) | (B1) | Dicarboxylic Acid A | 5.0 | 5.0 | — | — | — | — | 0.5 | 1.5 | — | — | — | — | — | — | 5.0 | 2.5 | 15.0 |
| | | | Dicarboxylic Acid B | — | — | 5.0 | — | — | — | — | — | — | — | — | — | — | — | — | — | — |
| | | | Dicarboxylic Acid C | — | — | — | 5.0 | — | — | — | — | — | — | — | — | — | — | — | — | — |
| | | | Dicarboxylic Acid D | — | — | — | — | 5.0 | — | — | — | — | — | — | — | — | — | — | — | — |
| | | | Dicarboxylic Acid E | — | — | — | — | — | 5.0 | — | — | — | — | — | — | — | — | — | — | — |
| | | (B2) | Dicarboxylic Acid F | — | — | — | — | — | — | — | — | — | — | — | — | 17.1 | — | — | 2.5 | 2.5 |
| | | | Dicarboxylic Acid G | — | — | — | — | — | — | — | — | — | — | — | — | — | 17.1 | — | — | — |
| | | | Monocarboxylic Acis A | — | — | — | — | — | — | — | — | 5.0 | — | — | — | — | — | — | — | — |
| | | | Monocarboxylic Acis B | — | — | — | — | — | — | — | — | — | 5.0 | — | — | — | — | — | — | — |
| | | | Monocarboxylic Acis C | — | — | — | — | — | — | — | — | — | — | 5.0 | — | — | — | — | — | — |
| | | | Monocarboxylic Acis D | — | — | — | — | — | — | — | — | — | — | — | 5.0 | — | — | — | — | — |
| | (C) | (C1) | Amide Thixotropic Agent A | 5.0 | 5.0 | 5.0 | 5.0 | 5.0 | 5.0 | 1.0 | 3.0 | — | — | — | — | — | 5.0 | — | — | 2.0 |
| | | | Amide Thixotropic Agent B | — | — | — | — | — | — | — | — | — | — | — | — | — | — | — | — | — |

TABLE 1-continued

| | | | Examples | | | | | | | | Comparatives | | | | | | | | | | | | | | |
|---|---|---|---|---|---|---|---|---|---|---|---|---|---|---|---|---|---|---|---|---|---|---|---|---|---|
| | | | 1 | 2 | 3 | 4 | 5 | 6 | 7 | 8 | 1 | 2 | 3 | 4 | 5 | 6 | 7 | 8 | 9 | 10 | 11 | 12 | 13 | 14 | 15 | 16 | 17 |
| | (C3) | Amide Thixotropic Agent C | — | — | — | — | — | — | — | — | — | — | — | — | — | — | — | — | — | — | — | — | — | — | — | 5.0 | — | — |
| | (D) | Solvent A | 50.0 | 50.0 | 50.0 | 50.0 | 50.0 | 50.0 | 58.5 | 55.5 | 60.0 | 55.0 | 55.0 | 55.0 | 55.0 | 55.0 | 55.0 | 55.0 | 55.0 | 55.0 | 55.0 | 55.0 | 55.0 | 42.9 | 37.9 | 50.0 | 55.0 | 40.5 |
| | | Total of Flux Composition | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 |
| Blending of Solder Composition (mass %) | | Flux Composition | 11.0 | 11.0 | 11.0 | 11.0 | 11.0 | 11.0 | 11.0 | 11.0 | 11.0 | 11.0 | 11.0 | 11.0 | 11.0 | 11.0 | 11.0 | 11.0 | 11.0 | 11.0 | 11.0 | 11.0 | 11.0 | 11.0 | 11.0 | 11.0 | 11.0 | 11.0 |
| | (D) | Solvent B | 1.6 | 1.6 | 1.6 | 1.6 | 1.6 | 1.6 | 1.6 | 1.6 | 1.6 | 1.6 | 1.6 | 1.6 | 1.6 | 1.6 | 1.6 | 1.6 | 1.6 | 1.6 | 1.6 | 1.6 | 1.6 | 1.6 | 1.6 | 1.6 | 1.6 | 1.6 |
| | (E) | Solder Powder | 87.4 | 87.4 | 87.4 | 87.4 | 87.4 | 87.4 | 87.4 | 87.4 | 87.4 | 87.4 | 87.4 | 87.4 | 87.4 | 87.4 | 87.4 | 87.4 | 87.4 | 87.4 | 87.4 | 87.4 | 87.4 | 87.4 | 87.4 | 87.4 | 87.4 | 87.4 |
| | | Total of Solder Composition | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 | 100 |
| Evaluation Results | (1) Solder Heat Resistance | Solid-coated Portion | A | A | A | A | A | A | B | B | C | D | D | D | C | C | A | A | A | A | A | A | B | B | B | C | D |
| | | Pattern | A | A | A | A | A | A | A | A | D | D | D | D | D | E | E | E | D | D | D | D | E | E | E | D | D |
| | (2) Solder Spreadability | | B | B | B | B | B | B | B | B | D | B | B | B | B | B | B | B | B | B | B | B | A | A | A | B | B | B |

As is clear from results shown in Table 1, it has been confirmed that the solder compositions of the invention (Examples 1 to 8) exhibit favorable results in terms of all of solder heat resistance (a solid-coated portion and a pattern) and solder spreadability.

Therefore, it has been confirmed that the solder composition of the invention is unlikely to affect the insulation coating and is excellent in solder spreadability.

What is claimed is:

1. A solder composition comprising:
    a flux composition comprising an (A) rosin resin, a (B) activator, a (C) thixotropic agent, and a (D) solvent; and
    (E) solder powder, wherein
    the (B) component comprises a (B1) dicarboxylic acid having 3 to 8 carbon atoms,
    the (C) component comprises at least one selected from the group consisting of a (C1) amide thixotropic agent having a hydroxy group in one molecule and a (C2) glycerol thixotropic agent having a hydroxy group in one molecule, and
    the solder composition satisfies a condition represented by Numerical Formula (F1) below provided that a total of contents of the (C1) component and the (C2) component is defined as X and a content of the (B1) component is defined as Y, $$X/2 \leq Y \leq 5X \quad \text{(F1)}.$$

2. The solder composition according to claim 1, wherein the (C1) component is a bisamide thixotropic agent having two or more hydroxy groups in one molecule.

3. The solder composition according to claim 1, wherein the solder composition is a solder composition for manufacturing a flexible circuit board.

4. The solder composition according to claim 3, wherein an insulation coating for the flexible circuit board is an alkaline-developable solder resist film.

5. A method for manufacturing a flexible circuit board by soldering using the solder composition according to claim 1, the method comprising:
    applying the solder composition on a flexible wiring board;
    placing an electronic component on the solder composition; and
    mounting the electronic component on the flexible wiring board through heating by a reflow furnace under predetermined conditions.

6. The method for manufacturing a flexible circuit board according to claim 5, wherein an insulation coating is formed on the flexible wiring board using an alkaline-developable solder resist.

7. The method for manufacturing a flexible circuit board according to claim 6, wherein the alkaline-developable solder resist comprises an (X1) photosensitive resin comprising a carboxyl group, an (X2) photopolymerization initiator, an (X3) epoxy compound, and an (X4) reactive dilution agent.

8. The method for manufacturing a flexible circuit board according to claim 7, wherein
    the (X3) component comprises at least one skeleton of a bisphenol A skeleton or a bisphenol F skeleton, and
    the (X4) component comprises caprolactone-modified (meth)acrylate.

9. The method for manufacturing a flexible circuit board according to claim 7, wherein the alkaline-developable solder resist further comprises an (X5) melamine compound.

10. The method for manufacturing a flexible circuit board according to claim 6, wherein the insulation coating endures for five or more cycles in a folding endurance test below,
    Folding Endurance Test:
        where a flexible wiring board is cut into a 25-mm width to prepare a test piece; the test piece is seam-folded and a weight of 1 kgf is applied on the test piece for five seconds; subsequently, the test piece is unfolded and a weight of 1 kgf is applied on a fold line for five seconds; the fold line is then checked using a magnifier; and the procedures are repeated until generation of cracking to measure the number of cycles.

* * * * *